United States Patent [19]

Miyamoto et al.

[11] Patent Number: 5,608,239
[45] Date of Patent: Mar. 4, 1997

[54] FIELD EFFECT TRANSISTOR

[75] Inventors: Hironobu Miyamoto; Tatsuo Nakayama, both of Tokyo, Japan

[73] Assignee: NEC Corporation, Tokyo, Japan

[21] Appl. No.: 357,216

[22] Filed: Dec. 13, 1994

[30] Foreign Application Priority Data

Dec. 16, 1993 [JP] Japan .................................. 5-316210

[51] Int. Cl.$^6$ .................. H01L 31/0328; H01L 31/0336
[52] U.S. Cl. ........................................... 257/192; 257/194
[58] Field of Search ................................. 257/192, 194, 257/280, 284

[56] References Cited

U.S. PATENT DOCUMENTS 5,285,087  2/1994  Narita et al. ............................ 257/194
5,298,453  3/1994  Hill .......................................... 437/89

FOREIGN PATENT DOCUMENTS 5-315365  11/1993  Japan .

OTHER PUBLICATIONS

"Study of the Consequence of Excess Indium in the Active Channel of InGaAs/InAlAs High Electron Mobility Transistors on Device Properties," Ng et al., Appl. Phys. Lett. 52 (9), Feb. 29, 1988, pp. 728–730.

"Characterization of Graded Interface $In_xGa_{1-x}As/In_{0.52}Al_{0.48}As$ (0.53<x<0.70) Structures Grown by Molecular-Beam Epitaxy," Peng et al., J. Appl. Phys. 62 (7), Oct. 1, 1987, pp. 2880–2884.

"Technical Report of IEICE ED92-102, CPM92-139," The Institute of Electronics, Information and Communication Engineers, Japan, 1992, pp. 43–48.

IEEE Transactions On Electron Devices, vol. 39, No. 10, Oct. 1992, New York, pp. 2206–2213.

Primary Examiner—Wael Fahmy
Attorney, Agent, or Firm—Popham, Haik Schnobrich & Kaufman, Ltd.

[57] ABSTRACT

The present invention relates to a field effect transistor with high speed and excellent high frequency characteristics. A hetero junction field effect transistor, comprising a first semiconductor layer that contains In, a second semiconductor layer that contains In whose composition ratio is smaller than that of the first semiconductor layer, and a third semiconductor layer whose electron affinity is smaller than that of the first semiconductor layer, wherein the first semiconductor layer, the second semiconductor layer, and the third semiconductor layer are successively disposed in the order, and wherein the thickness of the second semiconductor layer is equal to or larger than the thickness of two monolayers thereof and less than 4 nm. A current of this field effect transistor flows in the first semiconductor layer 3 and the second semiconductor layer 4 of the transistor. When the thickness of the second semiconductor layer 4 is 4 nm or more, the ratio of electrons that exist in the first semiconductor layer 3 is 85% or less of the case that the thickness of the second semiconductor layer 4 is almost zero. Thus, when the thickness of the second semiconductor layer 4 is decreased to the thickness of two monolayers thereof, the ratio of electrons that exist in the first semiconductor layer 3 becomes nearly 100%. Consequently, the high frequency characteristics of the transistor are improved.

11 Claims, 3 Drawing Sheets

FIELD EFFECT TRANSISTOR

FIELD OF THE INVENTION

The present invention relates to a field effect transistor with high speed and excellent high frequency characteristics.

BACKGROUND OF THE INVENTION

When a semiconductor layer with high composition ratio of In is used for a channel layer of a field effect transistor, since it has high electron mobility and high electron concentration, it provides excellent high frequency characteristics. For example, a technique for increasing the composition ratio of In in the channel layer of a field effect transistor on an InP substrate from 0.53 to 0.65 and thereby improving electron mobility and transconductance is known. This technique is disclosed in Applied Physics Letters, Vol. 52, No. 9, 1988, pp. 728–730. However, even if the composition ratio of In is increased, as is disclosed in Journal of Applied Physics, Vol. 62, 1987, pp. 2880–2884, if $x \geq 0.7$, the electron mobility of $In_xGa_{1-x}As$ was deteriorated and more higher characteristics could not be expected.

As a conventional method for preventing electron mobility from deteriorating, a structure for disposing a layer with a thickness of 4 nm that contains In whose composition ratio is equal to lattice constant of a substrate in a hetero interface of a field effect transistor having a semiconductor layer with high composition ratio of In was proposed in "Technical Report of IEICE ED92 -102,CPM92-139" The Institute of Electronics, Information and Communication Engineers, Japan, 1992. FIG. 5 shows the structure of the field effect transistor.

As shown in FIG. 5, an $In_{0.52}Al_{0.48}As$ layer 10 is disposed on a high resistance InP substrate 9. An $In_{0.8}Ga_{0.2}As$ layer 11 with a large composition ratio of In is disposed on the $In_{0.52}Al_{0.48}As$ layer 10. An $In_{0.53}Ga_{0.47}As$ layer 12 of whose is as thick as the lattice constant of the base substrate 9, and is low composition ratio of In, is disposed on the $In_{0.8}Ga_{0.2}As$ layer 11. A non-doped $In_{0.52}Al_{0.48}As$ layer 13 is disposed on the $In_{0.53}Ga_{0.47}As$ layer 12. An n-type $In_{0.52}Al_{0.48}As$ layer 14 is disposed on the non-doped $In_{0.52}Al_{0.48}As$ layer 13. The electron mobility of the structure with the $In_{0.53}Ga_{0.47}As$ layer 12 shown in FIG. 5 was more improved by 9% than that of the structure without the $In_{0.53}Ga_{0.47}As$ layer 12.

However, in the conventional field effect transistor shown in FIG. 5, the thickness of the $In_{0.53}Ga_{0.47}As$ layer 12, which is the second semiconductor layer, is as thick as 4 nm. Thereby the ratio of electrons that exist in the $In_{0.8}Ga_{0.2}As$ layer 11 as the first semiconductor layer is 85% of a total electron of the first semiconductor layer and the second semiconductor layer (as shown in FIG. 3).

Thus, since electrons flow in both the $In_{0.8}Ga_{0.2}As$ layer 11 and the $In_{0.53}Ga_{0.47}As$ layer 12, the characteristics of the $In_{0.8}Ga_{0.2}As$ layer 11 with high electron mobility and high electron saturation velocity could not be satisfactorily obtained as the characteristics of the field effect transistor.

SUMMARY OF THE INVENTION

An object of the present invention is to provide a field effect transistor having a semiconductor layer with a higher composition ratio of In and thereby high electron mobility that is used for a channel layer so as to improve high frequency characteristics.

To solve the above-mentioned problem, a first aspect of the present invention is a hetero junction field effect transistor, comprising a first semiconductor layer which contains In, an auxiliary activation layer which contains In whose composition ratio is smaller than that of the first semiconductor layer, a second semiconductor layer which contains In whose composition ratio is smaller than that of the first semiconductor layer, and a third semiconductor layer whose electron affinity is smaller than that of the first semiconductor layer, wherein the auxiliary activation layer, the first semiconductor layer, the second semiconductor layer, and the third semiconductor layer are successively disposed in that order, wherein the thickness of the second semiconductor layer is equal to or larger than the thickness of two monolayers thereof and less than 4 nm and wherein said third semiconductor layer contains a semiconductor layer with doped impurities.

A second aspect of the present invention is a hetero junction field effect transistor, comprising a first semiconductor layer which contains In, an auxiliary activation layer which contains In whose composition ratio is smaller than that of the first semiconductor layer, a second semiconductor layer which contains In whose energy band gap is larger than that of the first semiconductor layer, and a third semiconductor layer whose electron affinity is smaller than that of the first semiconductor layer, wherein the auxiliary activation layer, the first semiconductor layer, the second semiconductor layer, and the third semiconductor layer are successively disposed in that order, wherein the thickness of the second semiconductor layer is equal to or larger than the thickness of two monolayers thereof and less than 4 nm and wherein said third semiconductor layer contain a semiconductor layer with doped impurities.

A third aspect of the present invention is a field effect transistor that contains In, which has excellent high frequency characteristics, comprising;

a) a substrate with a high resistance, b) a layer that contains Al, that serves as a buffer layer, and that is disposed on the substrate a), c) an auxiliary activation layer that serves as a sub channel and that is disposed on the layer b), d) a first semiconductor layer with high electron mobility and high electron saturation velocity and that is disposed on the auxiliary activation layer c), e) a second semiconductor layer that contains In whose composition ratio is smaller than that of the first semiconductor layer d) and that is disposed thereon and wherein the thickness of the second semiconductor layer is equal to or larger than the thickness of monolayers thereof and less the 4 nm.

f) a third semiconductor with high purity that has smaller electron affinity than that of the first semiconductor layer and that is disposed on the second semiconductor layer e), g) an n-type third semiconductor layer that is contained in the third semiconductor layer f), h) a high purity layer that is purer than the third semiconductor layer f) and that is disposed on the third semiconductor layer g), and i) a fourth semiconductor layer that is an n-type semiconductor layer whose concentration is higher than that of the third semiconductor layer and that is disposed on the high purity layer h).

According to the present invention, since a second semiconductor layer that has a smaller composition ratio of In or a larger energy band gap than a first semiconductor layer with a high composition ratio of In is disposed between the first semiconductor layer and a third semiconductor layer with a smaller electron affinity than that of the second semiconductor layer so that the thickness of the second semiconductor layer is in the range of the thickness of two monolayers (approximately 0.587 nm )thereof to 4 nm, most electrons exist in the first semiconductor layer, thereby providing a field effect transistor having excellent high frequency characteristics.

DESCRIPTION OF THE PREFERRED EMBODIMENTS

An embodiments of the present invention in which is applied to a field effect transistor including In, are described below.

Figure 1:
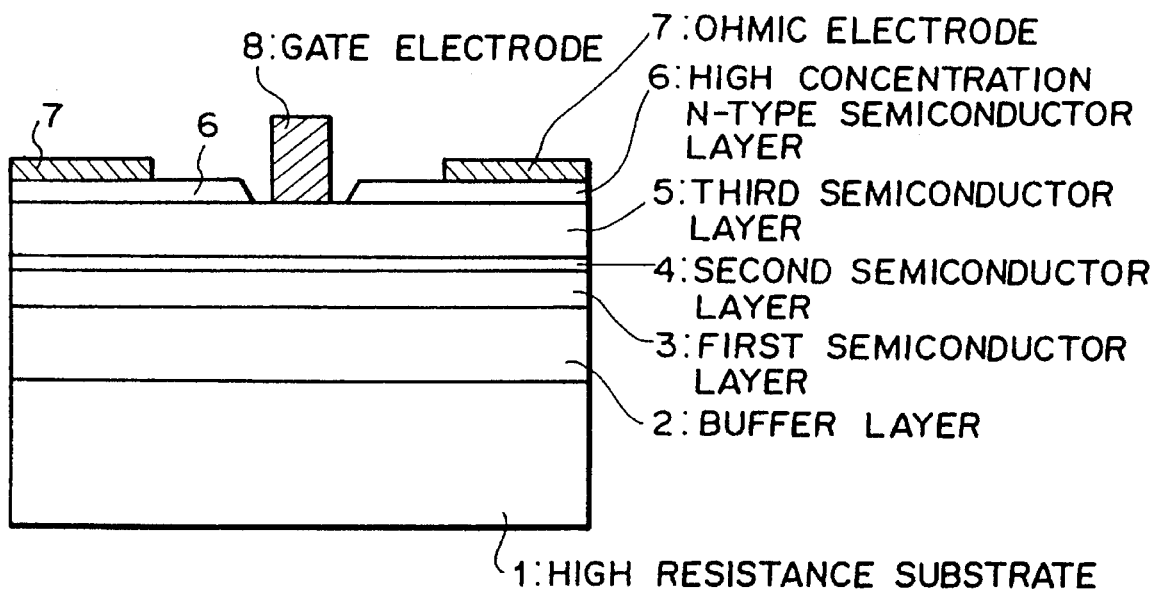
FIG. 1 is a sectional view showing the construction of a hetero junction type field effect transistor having a semiconductor layer that contains In according to a first embodiment of the present invention.

With reference to FIG. 1 that is a sectional view showing the construction of a field effect transistor according to the present invention, the theory, operation, and effect of the present invention will be described.

As shown in FIG. 1, a buffer layer 2 is disposed on a high resistance substrate 1. A first semiconductor layer 3 that contains In is disposed on the buffer layer 2. A second semiconductor layer 4 that contains In whose composition ratio is smaller than that of the first semiconductor layer 3 is disposed thereon. A third semiconductor layer 5 whose electron affinity is smaller than that of the first semiconductor layer 3 is disposed on the second semiconductor layer 4. A high concentration n-type semiconductor layer 6 is disposed on the third semiconductor layer 5. An ohmic electrode 7 is disposed on the high concentration n-type semiconductor layer 6. A gate electrode 8 is disposed on the third semiconductor layer 5.

Figure 3:
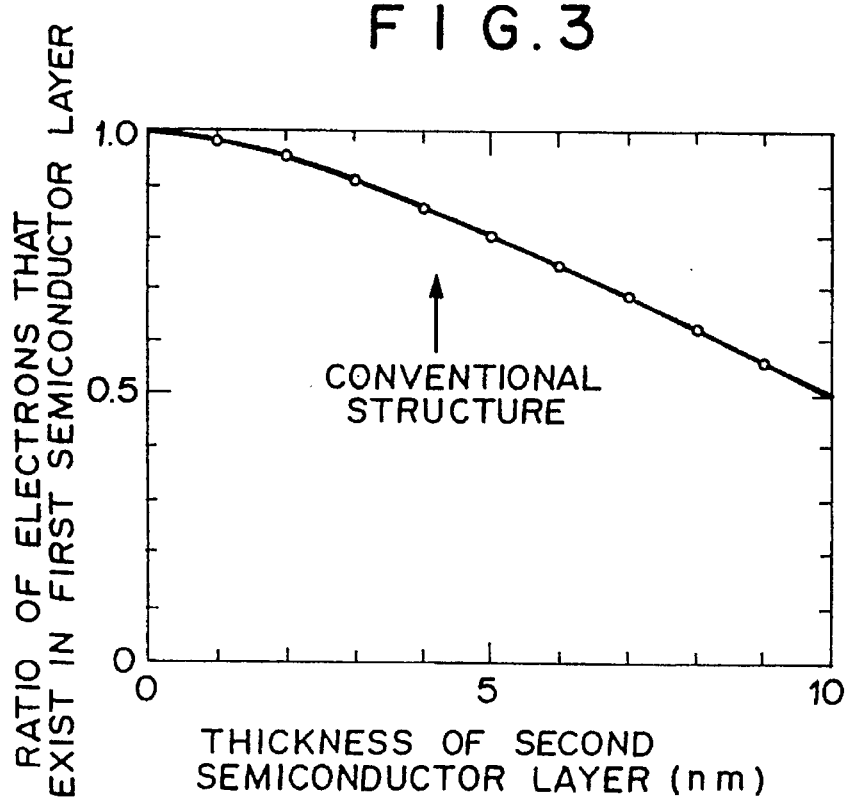
FIG. 3 is a graph showing calculation results of the ratio of electrons that exist in the first semiconductor layer of FIG. 1.

A current flows in both the first semiconductor layer 3 that contains In and the second semiconductor layer 4 that contains In whose composition ratio is smaller than that of the first semiconductor layer 3. FIG. 3 shows calculation results of the ratio of electrons that exist in the first semiconductor layer 3, which contains In. The calculation was made in the condition that the thicknesses of the $In_{0.52}Al_{0.48}As$ layer, the $In_{0.53}Ga_{0.47}As$ layer (which compose the buffer layer 2), the $In_{0.8}Ga_{0.2}As$ layer (which composes the first semiconductor layer 3), the $In_{0.53}Ga_{0.47}As$ layer (which composes the second semiconductor layer 4), the $In_{0.52}Al_{0.48}As$ layer, and the n-type $In_{0.52}Al_{0.48}As$ layer (which compose the third semiconductor layer 5) were 300 nm, 30 nm, 10 nm, 0–10 nm, 4 nm, and 20 nm, respectively. In FIG. 3, the horizontal axis represents the thickness of the second semiconductor layer 4, which is the $In_{0.53}Ga_{0.47}As$ layer (in nm), whereas the vertical axis represents the ratio of electrons that exist in the first semiconductor layer 3, which is the $In_{0.8}Ga_{0.2}As$ layer to the whole electrons of the first semiconductor layer 3 and the second semiconductor layer 3.

When the thickness of the second semiconductor layer ($In_{0.53}Ga_{0.47}As$ layer) is 4 nm, the ratio of electrons that exist in the first semiconductor layer ($In_{0.8}Ga_{0.2}As$ layer) 3 with high electron mobility and high electron saturation velocity is 85% of that of the case where the thickness of the second semiconductor layer ($In_{0.53}Ga_{0.47}As$ layer) is zero. When the thickness of the second semiconductor layer ($In_{0.53}Ga_{0.47}As$ layer) 4 is equal to the thickness of two monolayers thereof, the ratio of electrons increases to nearly 100%.

When the second semiconductor layer 4 is composed of $Al_xGa_{1-x}As$ (where $0 \leq x \leq 1$), $Al_xGa_{1-x}P$ (where $0 \leq x \leq 1$), $GaAs_xP_{1-x}$ (where $0 \leq x \leq 1$), $AlAs_xP_{1-x}$ (where $0 \leq x \leq 1$), or $In_xGa_{1-x}P$ (where $0 \leq x \leq 1$) that has a larger energy band gap than that of the first semiconductor layer, the deterioration of the electron mobility can be prevented. When the thickness of the semiconductor layer 4 is in the range of 4 nm to the thickness of two monolayers thereof, the ratio of electrons that exist in the first semiconductor layer ($In_{0.8}Ga_{0.2}As$ layer) 3, which has high electron mobility and high electron saturation velocity, becomes nearly 100%.

The field effect transistor of the present invention includes the first semiconductor of whose have the high electron mobility represented easiness of acceleration of electrons and the high electron saturation velocity represented the highest velocity of electrons in a particular electric field. And an auxiliary activation layer that is a sub channel is disposed below the first semiconductor layer with high electron mobility and high electron saturation velocity. And a buffer layer is disposed below the auxiliary activation layer. An InP substrate is disposed below the buffer layer. The buffer layer serves to match the lattice constant of the InP substrate and to prevent from adversely affecting the auxiliary activation layer by impure concentration of the InP substrate.

According to the present invention, since the second semiconductor layer 4 is disposed in the interface of the first semiconductor layer 3 and the third semiconductor layer 5, the electron mobility is not deteriorated and electrons flow in the first semiconductor layer 3 with high composition ratio of In. Thus, a field effect transistor with high speed and excellent high frequency characteristics can be accomplished.

The embodiments of this invention are concretely described following.

Figure 2:
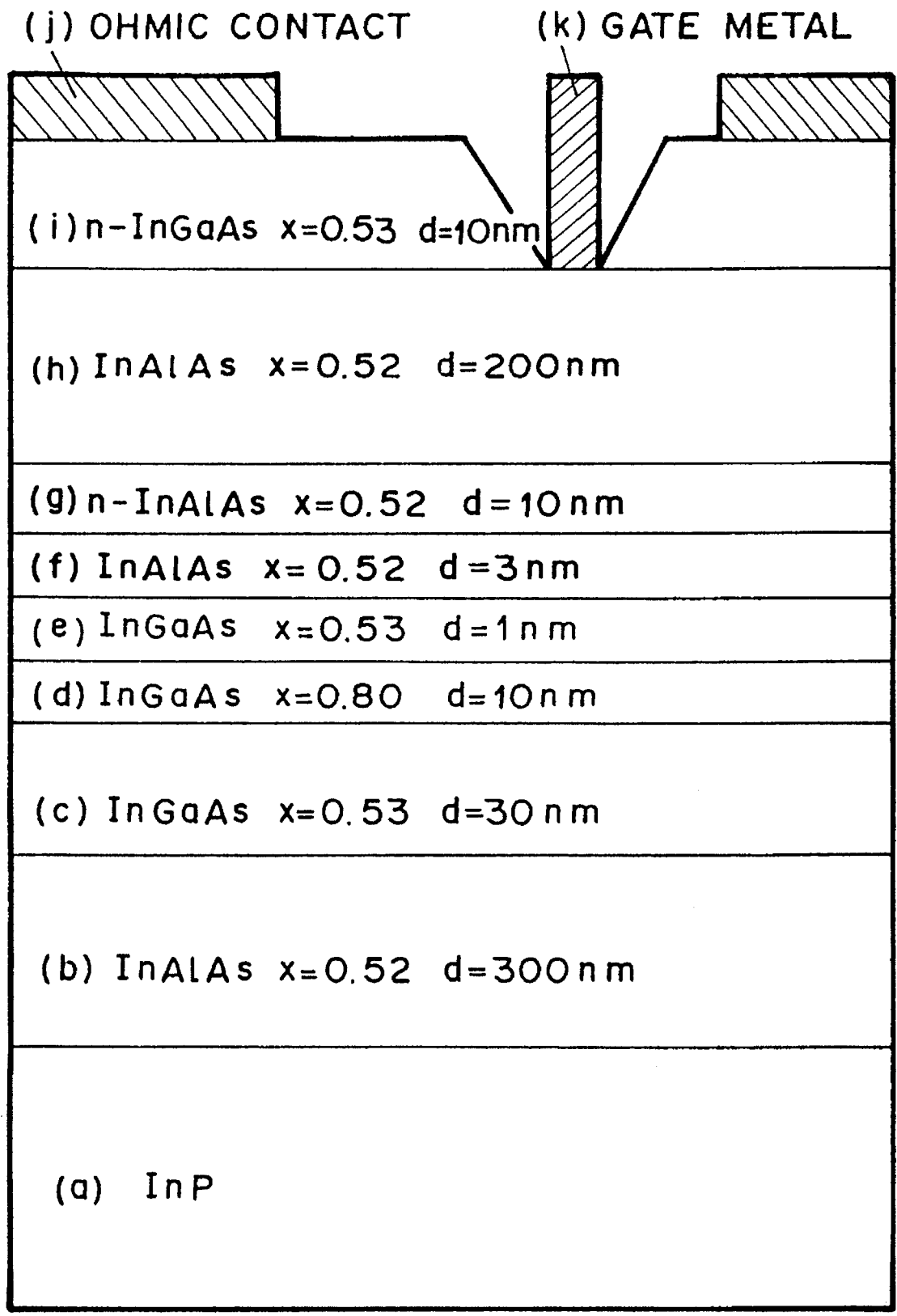
FIG. 2 is a detailed sectional view of FIG. 1.

With reference to FIGS. 1 and 2, embodiments of the present invention will be described. FIG. 1 is a sectional view showing the concept of the present invention. FIG. 2 is a sectional view showing the construction of an embodiment of the present invention.

First Embodiment

An InP substrate (a) that composes a high resistance substrate 1 is prepared. An $In_{0.52}Al_{0.48}As$ buffer layer (b) with a thickness of 300 nm and an $In_{0.53}Ga_{0.47}As$ layer (c) with a thickness of 30 nm that compose a buffer layer 2 are crystal grown on the InP substrate (a). An $In_{0.8}Ga_{0.2}As$ layer (d) with a thickness of 10 nm that composes a first semiconductor layer 3 is crystal grown on the $In_{0.53}Ga_{0.47}As$ layer (c). An $In_{0.53}Ga_{0.47}As$ layer (e) with a thickness of 1 nm that composes a second semiconductor layer 4 is crystal grown on the $In_{0.8}Ga_{0.2}As$ layer (d). A highly pure $In_{0.52}Al_{0.48}As$ layer (f) with a thickness of 3 nm, an n-type Si-doped $In_{0.52}Al_{0.48}As$ layer ($5\times10^{18}cm^{-3}$) (g) with a thickness of 10 nm, and a highly pure $In_{0.52}Al_{0.48}As$ layer (h) with a thickness of 200 nm that compose a third semiconductor layer 5 are crystal grown on the second semiconductor layer 4. An n-type Si-doped $In_{0.53}Ga_{0.47}As$ ($6\times10^{18}cm^{-3}$) (i) with a thickness of 10 nm that composes a high concentration n-type semiconductor layer 6 is crystal grown on the highly pure $In_{0.52}Al_{0.48}As$ layer (h).

An ohmic electrode (j) 7 that is composed of AuGe and Ni is deposited on the high concentration n-type semiconductor layer 6 by alloy process. A gate electrode (k) 8 that is composed of Ti, Pt, and Au is deposited onto the highly pure $In_{0.52}Al_{0.48}As$ layer (h) in an etched recess region from concentration n-type semiconductor layer 6. The gate electrode 8 is surrounded by the ohmic electrodes 7.

According to the first embodiment of the present invention, since the second semiconductor layer 4 is composed of the $In_{0.53}Ga_{0.47}As$ layer (e) with the thickness of 1 nm, most electrons exist in the first semiconductor layer 3 ($In_{0.8}Ga_{0.2}As$ layer (d)) with the thickness of 10 nm. Thus, the cut-off frequency Ft, which is an index of high frequency characteristics, of the field effect transistor having the gate electrode with a length of 0.15 μm according to the first embodiment was more improved in the range of 170 GHz to 200 GHz in comparison with the conventional structure having the second semiconductor layer 12 ($In_{0.53}Ga_{0.47}As$ layer) with the thickness of 4 nm as shown FIG.5.

The cut-off frequency of the field effect transistor according to the first embodiment of the present invention was further improved according to the thickness of the second semiconductor layer 4 ($In_{0.53}Ga_{0.47}As$ layer) decreased from 4 nm to the thickness of two monolayers thereof (0.587 nm or 5.87 angstroms).

Moreover, $In_xGa_{1-x}As$ (where $0.7\leq x\leq 1$) were used as the first semiconductor layer 3 instead of the $In_{0.8}Ga_{0.2}As$ layer, and $In_xGa_{1-x}As$ (where $0\leq x\leq 0.53$) were used as the second semiconductor layer 4 instead of the $In_{0.53}Ga_{0.47}As$ layer, respectively. In this case, the same effects as the first embodiments were obtained.

In addition, the third semiconductor layer is especially divided into a highly pure $In_{0.52}Al_{0.48}As$ layer (f), an n-type Si-doped $In_{0.52}Al_{0.48}As$ layer (g) and a highly pure $In_{0.52}Al_{0.48}As$ layer (h) because of operating as the field effect transistor. When the thickness of the second semiconductor layer 4 is less than or equal to the thickness of two monolayers thereof, the hetero interface is deteriorated and thereby the mobility of electrons that flow in the first semiconductor layer decreases.

On the other hand, when the thickness of the second semiconductor layer is 4 nm or more, as shown in FIG. 3, the ratio of electrons that exist in the second semiconductor layer is less than 85%. In this case, the cut-off frequency of the field effect transistor cannot be assured.

Figure 4:
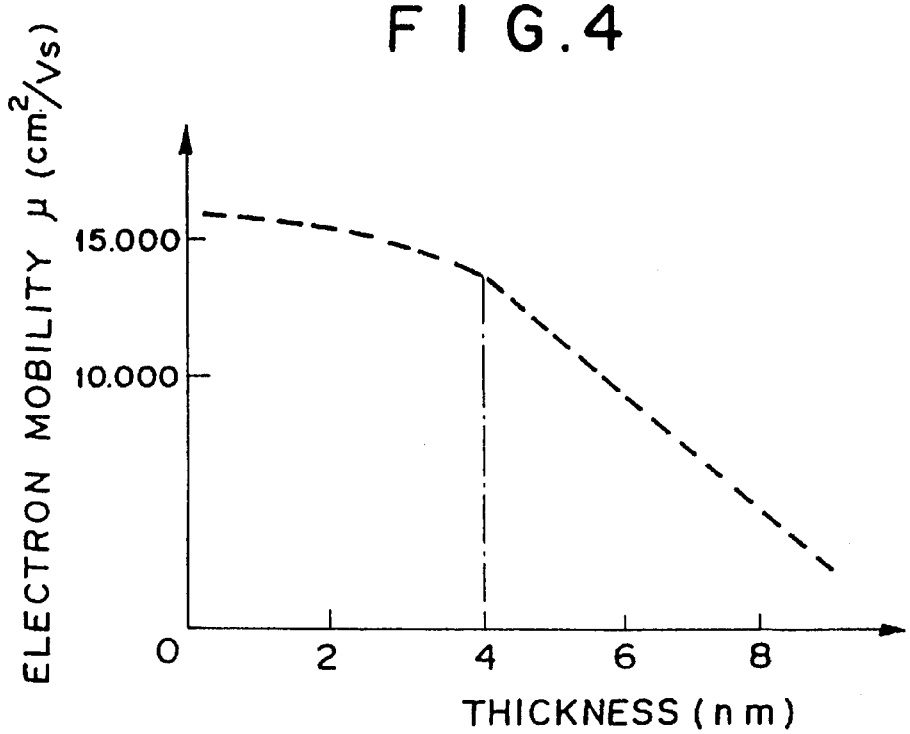
FIG. 4 is a graph showing the relation between the thickness of the second semiconductor and the electron mobility of FIG. 1.

FIG. 4 is a graph showing the relation between the thickness of the second semiconductor layer 4 and the electron mobility. As is clear from FIG. 4, when the thickness of the second semiconductor layer is 4 nm or less, the electron mobility increased unlike above-mentioned priority art.

Figure 5:
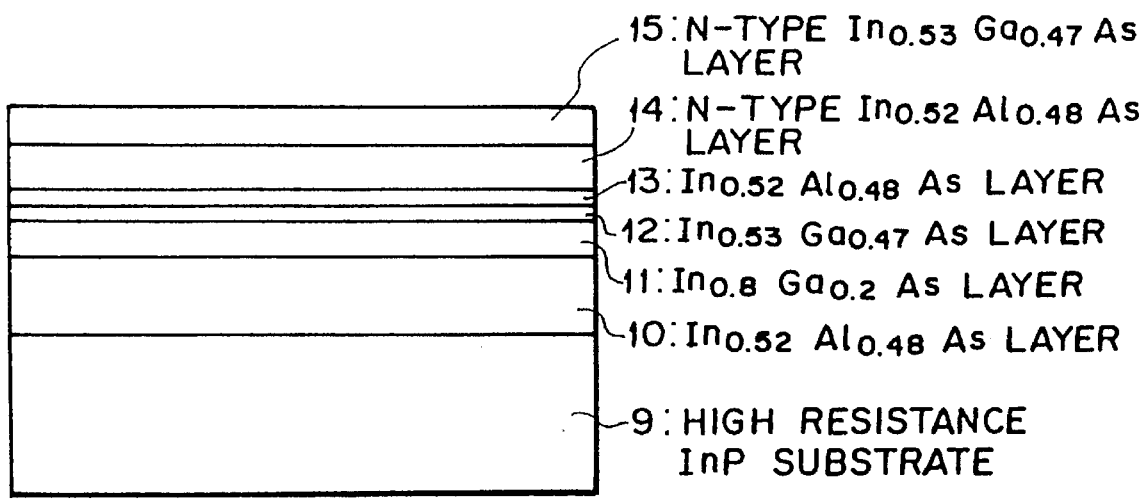
FIG. 5 is a sectional view showing the construction of a conventional hetero junction type field effect transistor.

Although the structures of the individual layers of the present invention differ from those of the prior art shown in FIG. 5, there is a good reason that the present invention is a field effect transistor that was really fabricated and composed of individual layers necessary for the field effect transistor.

Second Embodiment

Next, with reference to FIG. 2, a second embodiment of the present invention will be described.

An InP substrate (a) that composes a high resistance substrate 1 is prepared. An $In_{0.52}Al_{0.48}As$ buffer layer (b) with a thickness of 300 nm and an $In_{0.53}Ga_{0.47}As$ layer (c) with a thickness of 30 nm that compose a buffer layer 2 are crystal grown on the InP substrate (a). An $In_{0.8}Ga_{0.2}As$ layer (d) with a thickness of 10 nm that composes a first semiconductor layer 3 is crystal grown on the $In_{0.53}Ga_{0.47}As$ layer (c). A GaAs layer (e) with a thickness of 1 nm that composes a second semiconductor layer 4 is crystal grown on the $In_{0.8}Ga_{0.2}As$ layer (d) instead of the $In_{0.53}Ga_{0.47}As$ layer (e) of the first embodiment. A highly pure $In_{0.52}Al_{0.48}As$ layer (f) with a thickness of 3 nm, an n-type Si-doped $In_{0.52}Al_{0.48}As$ layer ($5\times10^{18}cm^{-3}$) (g) with a thickness of 10 nm, and a highly pure $In_{0.52}Al_{0.48}As$ layer (h) with a thickness of 200 nm that compose a third semiconductor layer 5 are crystal grown on the second semiconductor layer 4. An n-type Si-doped $In_{0.53}Ga_{0.47}As$ ($6\times10^{18}cm^{-3}$) (i) with a thickness of 10 nm that composes a high concentration n-type semiconductor layer 6 is crystal grown on the highly pure $In_{0.52}Al_{0.48}As$ layer (h).

An ohmic electrode (j) 7 that is composed of AuGe and Ni is deposited on the high concentration n-type semiconductor layer 6 by alloy process. A gate electrode (k) 8 that is composed of Ti, Pt, and Au is deposited in an etched recess region of the high concentration n-type semiconductor layer 6. The gate electrode 8 is surrounded by the ohmic electrodes 7.

According to the second embodiment, since the GaAs layer that has larger energy band gap than that of the first semiconductor layer 3 is used as the second semiconductor layer 4, when the thickness of the second semiconductor layer 4 is in the range of the thickness of two monolayers thereof (0.587 nm) to 4 nm, most electrons exist in the first semiconductor layer 3 ($In_{0.8}Ga_{0.2}As$ layer). Thus, the cut-off frequency Ft, which is an index of high frequency characteristics, of the field effect transistor having the gate electrode with a length of 0.15 μm according to the second embodiment was more improved in the range of 170 GHz to 200 GHz in comparison with the conventional structure having the second semiconductor layer 12 ($In_{0.53}Ga_{0.47}As$ layer) with the thickness of 4 nm.

Further $In_xGa_{1-x}As$ (where $0.7\leq x\leq 1$) was used as the first semiconductor layer 3 instead of the $In_{0.8}Ga_{0.2}As$ layer, and $Al_xGa_{1-x}As$ (where $0\leq x\leq 1$) was used as the second semiconductor layer 4 instead of the GaAs layer, respectively. In this case the same effects as the first embodiments were obtained.

Third Embodiment An InP substrate (a) that composes a high resistance substrate 1 is prepared. An $In_{0.52}Al_{0.48}As$ buffer layer (b) with a thickness of 300 nm and an $In_{0.53}Ga_{0.47}As$ layer (c) with a thickness of 30 nm that compose a buffer layer 2 are crystal grown on the InP substrate (a). An $In_{0.8}Ga_{0.2}As$ layer (d) with a thickness of 10 nm that composes a first semiconductor layer 3 is crystal grown on the $In_{0.53}Ga_{0.47}As$ layer (c). A GaAs layer (e) with a thickness of 1 nm that composes a second semiconductor layer 4 is crystal grown on the $In_{0.8}Ga_{0.3}As$ layer (d) instead of the $In_{0.53}Ga_{0.47}As$ layer (e) of the first embodiment. A highly pure $In_{0.52}Al_{0.48}As$ layer (f) with a thickness of 3 nm, an n-type Si-doped $In_{0.52}Al_{0.48}As$ layer ($5\times10^{18}cm^{-3}$) (g) with a thickness of 10 nm, and a highly pure $In_{0.52}Al_{0.48}As$ layer (h) with a thickness of 200 nm that compose a third semiconductor layer 5 are crystal grown on the second semiconductor layer 4. An n-type Si-doped $In_{0.53}Ga_{0.47}As$ ($6 \times 10^{18}$cm$^{-3}$) (i) with a thickness of 10 nm that composes a high concentration n-type semiconductor layer 6 is crystal grown on the highly pure In$_{0.52}$Al$_{0.48}$As layer (h).

An ohmic electrode (j) 7 that is composed of AuGe and Ni is deposited on the high concentration n-type semiconductor layer 6 by alloy process. A gate electrode (k) 8 that is composed of Ti, Pt, and Au is deposited onto the highly pure In$_{0.52}$Al$_{0.48}$As layer 5 in an etched recess region of the high concentration n-type semiconductor layer 6. The gate electrode 8 is surrounded by the ohmic electrodes 7.

According to the third embodiment, since the GaP layer that has larger energy band gap than that of the first semiconductor layer 3 is used as the second semiconductor layer 4, when the thickness of the second semiconductor layer 4 is in the range of the thickness of two monolayers thereof (0,587 nm) to 4 nm, most electrons exist in the first semiconductor layer 3 (In$_{0.8}$Ga$_{0.2}$As layer) with the thickness of 10 nm. Thus, the cut-off frequency Ft, which is an index of high frequency characteristics, of the field effect transistor having the gate electrode with a thickness of 0.15 µm according to the third embodiment was more improved in the range of 170 GHz to 200 GHz in comparison with the conventional structure having the second semiconductor layer 12 (In$_{0.53}$Ga$_{0.47}$As layer) with the thickness of 4 nm.

After further execution, In$_x$Ga$_{1-x}$As (where $0.7 \leq x \leq 1$) was used as the first semiconductor layer 3 instead of the In$_{0.8}$Ga$_{0.2}$As layer, and Al$_x$Ga$_{1-x}$As (where $0 \leq x \leq 1$), GaAs$_x$P$_{1-x}$ (where $0 \leq x \leq 1$), AlAs$_x$P$_{1-x}$ (where $0 \leq x \leq 1$), In$_x$Ga$_{1-x}$P (where $0 \leq x \leq 1$), or GaAs$_x$P$_{1-x}$ (where $0 \leq x \leq 1$) were used as the second semiconductor layer 4 instead of the GaP layer, respectively. In this case, the same effects as the first embodiments were obtained.

While this invention has been particularly shown and described with reference to the preferred embodiment thereof, it will be understood that various changes in form and details may be made therein without departing from the spirit and scope of the invention.

What is claimed is:

1. A field effect transistor having a semiconductor including In, comprising:

a first semiconductor layer which contains In;

an auxiliary activation layer which contains In whose composition ratio is smaller than that of said first semiconductor layer;

a second semiconductor layer which contains In whose composition ratio is smaller than that of said first semiconductor layer; and a third semiconductor layer whose electron affinity is smaller than that of said first semiconductor layer,
   wherein said auxiliary activation layer, said first semiconductor layer, said second semiconductor layer, and said third semiconductor layer are successively disposed in that order,
   wherein the thickness of said second semiconductor layer is equal to or larger than that thickness of two monolayers thereof and less than 4 nm, and
   wherein said third semiconductor layer comprises a highly pure semiconductor layer disposed on said second semiconductor layer and an impurity doped layer disposed on said highly pure semiconductor layer.

2. The field effect transistor as set forth in claim 1,
   wherein said first semiconductor layer is composed of In$_x$Ga$_{1-x}$As (where $0.70 \leq x \leq 1.0$), and
   wherein said second semiconductor layer is composed of In$_y$Ga$_{1-y}$As (where $0 < y < x$).

3. The field effect transistor as set forth in claim 1 wherein said third semiconductor layer comprises an n-type Si-doped layer disposed between highly pure semiconductor layers.

4. A field effect transistor, comprising:

a first semiconductor layer which contains In;

an auxiliary activation layer which contains In whose composition ratio is smaller than that of said first semiconductor layer;

a second semiconductor layer whose energy band gap is larger than that of said first semiconductor layer; and a third semiconductor layer whose electron affinity is smaller than that of said first semiconductor layer,
   wherein said auxiliary activation layer, said first semiconductor layer, said second semiconductor layer, and said third semiconductor layer are successively disposed in that order,
   wherein the thickness of said second semiconductor layer is equal to or larger than that thickness of two monolayers thereof and less than 4 nm, and
   wherein said third semiconductor layer comprises a highly pure semiconductor layer disposed on said second semiconductor layer and an impurity doped layer disposed on said highly pure semiconductor layer.

5. The field effect transistor as set forth in claim 4,
   wherein said first semiconductor layer is composed of In$_x$Ga$_{1-x}$As (where $0.70 \leq x < 1.0$), and
   wherein said second semiconductor layer is composed of at least one of Al$_x$Ga$_{1-x}$As (where $0 \leq x \leq 1$), Al$_y$Ga$_{1-y}$P (where $0 \leq y \leq 1$), GaAs$_z$P$_{1-z}$ (where $0 \leq z \leq 1$) and AlAs$_u$P$_{1-u}$ (where $0 \leq u \leq 1$).

6. The field effect transistor as set forth in claim 4, wherein said second semiconductor layer is composed of at least one of In$_x$Ga$_{1-x}$P where $0 \leq x \leq 1$) and In$_y$Al$_{1-y}$P (where $0 \leq y \leq 1$).

7. The field effect transistor as set forth in claim 4 wherein said third semiconductor layer comprises an n-type Si-doped layer disposed between highly pure semiconductor layers.

8. A field effect transistor containing In, which comprises:

a high resistance substrate;

a buffer layer disposed on said high resistance substrate;

an auxiliary activation layer which serves as a sub channel and is disposed on said buffer layer;

a first semiconductor layer which contains In and is disposed on said auxiliary activation layer;

a second semiconductor layer which contains In whose composition ratio is smaller than that of said first semiconductor layer and is disposed thereon;

a third semiconductor layer whose electron affinity is smaller than that of said first semiconductor layer, which is disposed on said second semiconductor layer;

a fourth semiconductor layer which is a higher concentration n-type semiconductor layer than said third semiconductor layer and is disposed on said third semiconductor layer;

an ohmic electrode which is ohmic-contacted with a part of said fourth semiconductor layer; and a gate electrode disposed onto said third semiconductor in a recessed region of said fourth semiconductor layer,
   wherein the thickness of said second semiconductor layer is equal to or larger than the thickness of two monolayers thereof and less than 4 nm; and
   wherein said third semiconductor layer comprises a highly pure semiconductor layer disposed on said second semiconductor layer and an impurity doped layer disposed on said highly pure semiconductor layer.

9. The field effect transistor as set forth in claim 8 wherein said third semiconductor layer comprises an n-type Si-doped layer disposed between highly pure semiconductor layers.

10. A field effect transistor that contains In, comprising:

a) a substrate with a high resistance;

b) a layer that contains Al, that serves as a buffer layer, and that is disposed on said substrate a);

c) an auxiliary activation layer that serves as a sub channel and that is disposed on said layer b);

d) a first semiconductor layer with high electron mobility and high electron saturation velocity and that is disposed on said auxiliary activation layer c);

e) a second semiconductor layer that contains In whose composition ratio is smaller than that of said first semiconductor layer d) and that is disposed thereon and wherein the thickness of the second semiconductor layer is equal to or larger than the thickness of two monolayers thereof and less than 4 nm;

f) a third semiconductor with high purity that has smaller electron affinity than that of said first semiconductor layer and that is disposed on said second semiconductor layer e);

g) an n-type semiconductor layer that is contained in said third semiconductor layer f);

h) a high purity layer that is purer than said third semiconductor layer f), that is disposed on said n-type semiconductor layer g) of said third semiconductor, and contained in said third semiconductor; and i) a fourth semiconductor layer that is an n-type semiconductor layer whose concentration is higher than that of said third semiconductor layer and that is disposed on said high purity layer h).

11. The field effect transistor as set forth in claim 10, further comprising:

j) an ohmic electrode that is ohmic-contacted with a part of said fourth semiconductor layer; and k) a gate electrode that is disposed in a recessed region of said fourth semiconductor layer.

* * * * *